United States Patent
Kasai et al.

[11] Patent Number: 5,962,343
[45] Date of Patent: *Oct. 5, 1999

[54] PROCESS FOR PRODUCING CRYSTALLINE CERIC OXIDE PARTICLES AND ABRASIVE

[75] Inventors: Toshio Kasai, Urawa; Isao Ota, Funabashi; Takao Kaga, Tokyo; Tohru Nishimura, Funabashi; Kenji Tanimoto, Toyama-ken, all of Japan

[73] Assignee: Nissan Chemical Industries, Ltd., Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/899,796

[22] Filed: Jul. 24, 1997

[30] Foreign Application Priority Data

Jul. 30, 1996 [JP] Japan ................. 8-200056
Aug. 1, 1996 [JP] Japan ................. 8-203450

[51] Int. Cl.⁶ .................................... B24D 3/34
[52] U.S. Cl. ................ 438/693; 438/691; 438/692; 423/263; 252/302; 51/309
[58] Field of Search ................ 51/309; 438/691, 438/692, 693; 252/302; 423/263

[56] References Cited

U.S. PATENT DOCUMENTS

| | | | |
|---|---|---|---|
| 4,606,847 | 8/1986 | Woodhead | 252/363.5 |
| 4,647,401 | 3/1987 | Gradeff et al. | 252/309 |
| 5,543,126 | 8/1996 | Ota et al. | 423/263 |
| 5,662,874 | 9/1997 | David | 423/263 |

FOREIGN PATENT DOCUMENTS

| | | |
|---|---|---|
| 243399 | 9/1987 | Czechoslovakia . |
| 2 583 034-A1 | 12/1986 | France . |
| 2 727 328-A1 | 5/1996 | France . |
| A 58-55334 | 4/1983 | Japan . |
| A 5-262519 | 10/1993 | Japan . |
| A 6-2582 | 1/1994 | Japan . |
| A 8-81218 | 3/1996 | Japan . |
| WO 79/00248 | 5/1979 | WIPO . |
| WO 87/04421 | 7/1987 | WIPO . |
| WO 95/03252 | 2/1995 | WIPO . |

OTHER PUBLICATIONS

Chemical Abstract vol. 108, No. 115183c "Method of Cerium Oxidation" (1988). (no month).
Sanderson, R.T. *Inorganic Chemistry*. Hirokawa Publishing Co., Apr. 1982, pp. 346–349.

*Primary Examiner*—Deborah Jones
*Attorney, Agent, or Firm*—Oliff & Berridge, PLC

[57] ABSTRACT

According to the present invention, a process is provided for producing crystalline ceric oxide particles having a particle diameter of 0.005 to 5 μm, which comprises the steps of reacting a cerium (III) salt with an alkaline substance in an (OH)/(Ce³⁺) molar ratio of 3 to 30 in an aqueous medium in an inert gas atmosphere to produce a suspension of cerium (III) hydroxide, and blowing oxygen or a gas containing oxygen into the suspension at a temperature of 10 to 95° C. and at an atmospheric pressure.

12 Claims, 1 Drawing Sheet

PROCESS FOR PRODUCING CRYSTALLINE CERIC OXIDE PARTICLES AND ABRASIVE

BACKGROUND OF THE INVENTION

1. Field of the Invention

The present invention relates to a process for producing crystalline ceric oxide particles. The ceric oxide is used as an abrasive, ultraviolet absorbing material, catalyst material, fuel cell material and the like. Out of these, the crystalline ceric oxide of the present invention provides an excellent material for use as an abrasive and an ultraviolet absorbing material.

Further, the present invention relates to the modification of the surface of a ceric oxide particle or a particle essentially composed of ceric oxide obtained by calcining and grinding or a composition containing a rare earth element essentially composed of cerium, as well as to an abrasive comprising the surface modified particles and a polishing method.

2. Description of the Related Art

Japanese Laid-open Patent Application No. Sho 63-502656 discloses a process for producing ceric oxide particles having a particle diameter of 0.05 to 10 $\mu$m by holding an aqueous solution of cerium (III) nitrate or cerium (IV) nitrate in a sealed container at a temperature of 200 to 600° C. and at a pressure of not less than 40 atm.

Japanese Laid-open Patent Application No. Hei 6-2582 discloses a process for producing crystalline ceric oxide particles having a particle diameter of not more than 300 angstroms which comprises cleaning a gel obtained by reacting a cerium salt compound and an alkali metal hydroxide or ammonia to remove impurities, adding an acid such as nitric acid or acetic acid to the gel, and subjecting the resulting mixture to a hydrothermal treatment at 100° C. or more.

Japanese Laid-open Patent Application No. Hei 8-81218 discloses a process for producing ceric oxide particles having a particle diameter of 0.03 to 5 $\mu$m which comprises adjusting pH values of a solution comprising ceric hydroxide and a nitrate to 8 to 11 using an alkaline substance and heating the solution at a temperature of 100 to 200° C. under pressurization.

It is known that cerium is an element which is easily oxidized from valence (III) to valence (IV) in lanthanoids. For example, it is described on page 348 of "Inorganic Chemistry Vol. 1" written by Thunderson and published by Hirokawa Shoten on Apr. 25, 1982 that cerium (IV) is produced when an alkaline suspension of cerium (III) hydroxide is exposed to air.

Since a hydrothermal treatment is carried out at a temperature of not lower than 100° C. under such a condition that a corrosive substance such as nitric acid or acetic acid is contained in all the processes of Japanese Laid-open Patent Application Nos. Sho 63-502656, Hei 6-2582 and Hei 8-81218, a high-pressure container that meets the reaction conditions is required and further acid-resistant Teflon, glass or a corrosion-resistant alloy such as hastelloy must be used as a material for the high-pressure container.

By the way, it has been proved that cerium oxide particles or the particles of a composition essentially composed of cerium oxide have excellent performance as an abrasive for polishing inorganic glass, quartz crystal and quartz glass.

Japanese Laid-open Patent Application No. Sho 58-55334 discloses a process for producing a dispersible product containing a cerium compound which comprises heating a cerium (IV) oxide hydrate in the presence of a salt and disintegrating agglomerated fine crystals contained in the cerium (IV) oxide hydrate. The above publication teaches that ammonium nitrate is used as the salt in addition to a metal nitrate, metal chloride and metal perchlorate. The publication further teaches that a solution containing a cerium (IV) oxide hydrate and ammonium nitrate was dried at 105° C. and further heated at 300° C. to obtain a product containing ceric oxide and a nitrate which was then dispersed in water to obtain a gel, as an embodiment of the invention. However, the description is not made about the application of this gel.

Japanese Laid-open Patent Application No. Hei 5-262519 discloses a process for producing a rare earth oxide which comprises mixing an oxalate, rare earth compound and ammonium salt in an aqueous medium, separating a precipitate produced at 30 to 90° C. and calcining the obtained oxalic acid rare earth ammonium double salt at 600 to 1,200° C. The above publication teaches that ammonium nitrate, ammonium chloride, ammonium acetate or the like is used as the ammonium salt and cerium nitrate is used as the rare earth compound.

SUMMARY OF THE INVENTION

It is an object of the present invention to provide a process for producing crystalline ceric oxide from a cerium (III) salt based on a reaction mechanism that cerium (IV) is produced when an alkaline suspension of cerium (III) hydroxide is exposed to an oxidant such as air, by which crystalline ceric oxide particles having a particle diameter controlled to any value within the range of 0.005 to 5 $\mu$m are produced by controlling the nucleus generation and crystal growth speeds of the crystalline ceric oxide particle. As the crystalline ceric oxide particles are produced at normal pressure (atmospheric pressure) in this process, a bulky high-pressure container is not necessary, thereby making it possible to produce crystalline ceric oxide particles by safe operation at a low cost.

A silicon oxide film ($SiO_2$ film) for a semiconductor device, quartz glass for a photo mask and a quartz piece for a crystal oscillator are becoming in need of a polished surface having high flatness and accordingly, an abrasive having a particle diameter in a submicron or lower order must be used.

When the particle diameter of an abrasive used for polishing these is reduced, mechanical polishing force is lowered, thereby lowering the polishing speed and productivity in the polishing step with the result of an increase in product cost. If the polishing speed can be increased without changing the particle diameter of an abrasive particle, the productivity of the polishing step will improve.

When a silicon oxide film ($SiO_2$ film) is used as a stopper (layer for stopping polishing) for flattening an interlayer film for a semiconductor device, if only a soft film such as an organic resin film can be polished without polishing a hard film such as a silicon oxide film ($SiO_2$ film) so that polishing of a soft film such as an organic resin film proceeds while polishing of a hard film such as a silicon oxide film ($SiO_2$ film) stops, the application of an abrasive to lithography is expected.

It is another object of the present invention to provide an abrasive comprising ceric oxide particles or particles essentially composed of ceric oxide prepared by heating ceric oxide particles or particles essentially composed of ceric oxide obtained by calcining and grinding a composition containing a rare earth element essentially composed of cerium in an aqueous medium at a temperature of 50 to 250° C. in the presence of an ammonium salt. This abrasive is composed of surface modified ceric oxide particles. The polishing speed can be controlled and a polishing method suitable for the properties of a surface to be polished can be adopted for an abrasive composed of ceric oxide particles obtained according to type of a chemical used for surface modification.

According to a first aspect of the present invention, there is provided a process for producing crystalline ceric oxide particles having a particle diameter of 0.005 to 5 μm (micrometer), which comprises the steps of:

reacting a cerium (III) salt and an alkaline substance in an (OH)/($Ce^{3+}$) molar ratio of 3 to 30 in an aqueous medium in an inert gas atmosphere to produce a suspension of cerium (III) hydroxide, and immediately blowing oxygen or a gas containing oxygen into the suspension at a temperature of 10 to 95° C. and at an atmospheric pressure.

According to a second aspect of the present invention, there is provided an abrasive composed of ceric oxide particles which are heated at a temperature of 50 to 250° C. in an aqueous medium in the presence of an ammonium salt.

According to a third aspect of the present invention, there is provided a polishing method using an abrasive composed of ceric oxide particles which are heated at a temperature of 50 to 250° C. in an aqueous medium in the presence of an ammonium salt.

DETAILED DESCRIPTION OF THE PREFERRED EMBODIMENTS

Figure 1:
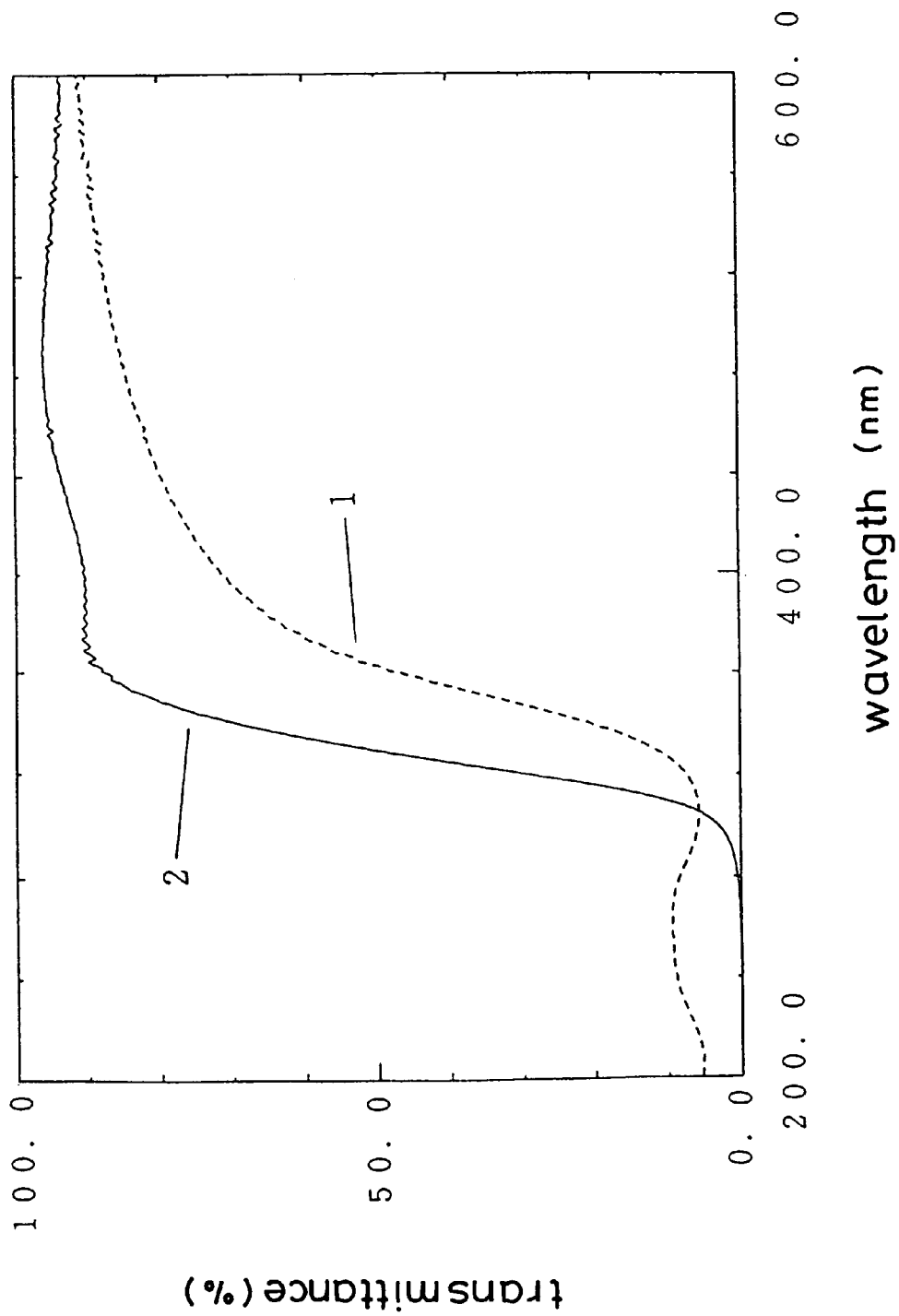
FIG. 1 is a diagram for comparing the relationship between the light wavelength and transmittance of glass coated with a ceric oxide sol obtained in Example 1 of the present invention and the relationship between the light wavelength and transmittance of glass coated with a titanic oxide sol.

In the first aspect of the present invention, the first step is to react a cerium (III) salt with an alkaline substance in an (OH)/($Ce^{3+}$) molar ratio of 3 to 30 in an aqueous medium in an inert gas atmosphere to produce cerium (III) hydroxide, that is, a suspension of cerous hydroxide.

For the reaction in an inert gas atmosphere, a reactor equipped with a gas substitutable stirrer and a thermometer is used to react a cerium (III) salt and an alkaline substance in an aqueous medium. Water is generally used as the aqueous medium but a slight amount of a water-soluble organic solvent may be contained in the aqueous medium. Gas substitution is carried out by immersing a tubular gas introduction port into the aqueous medium, blowing an inert gas into the aqueous medium and discharging the gas from a discharge port provided in the above of the aqueous medium in the reactor to fill the reactor with the inert gas. It is preferred to start the reaction after the substitution of the inert gas. Stainless steel, glass lining or the like can be used as the material of this reactor. At this point, the pressure inside the reactor is desirably an atmospheric pressure and hence, the inflow of the gas is preferably almost equal to the outflow of the gas. The inflow and outflow of the gas are preferably 0.01 to 20 liters/min based on 1 liter of the reaction tank capacity.

A nitrogen gas, argon gas or the like is used as the inert gas, out of which a nitrogen gas is particularly preferred.

Illustrative examples of the cerium (III) salt include cerous nitrate, cerous chloride, cerous sulfate, cerous carbonate, ammonium cerium (III) nitrate and the like. These cerium (III) salts may be used alone or in admixture.

Illustrative examples of the alkaline substance include alkali metal hydroxides such as sodium hydroxide and potassium hydroxide and organic bases such as ammonia, amines, quaternary ammonium hydroxide, out of which ammonium, sodium hydroxide and potassium hydroxide are particularly preferred. They may be used alone or in admixture.

Although the above cerium (III) salt and the alkaline substance may be added to an aqueous medium to start a reaction in the reactor, an aqueous solution of the cerium (III) salt and an aqueous solution of the alkaline substance are prepared and mixed together to start a reaction. The cerium (III) salt is preferably used in an amount of 1 to 50 wt % in the aqueous medium.

The ratio of the cerium (III) salt to the alkaline substance is 3 to 30, preferably 6 to 12 in terms of (OH)/($Ce^{3+}$) molar ratio. When the ratio is smaller than 3, the cerium (III) salt cannot be completely neutralized into the cerium (III) hydroxide and partially remains in the suspension disadvantageously. Since this cerium (III) salt is oxidized into cerium (IV) much more slowly than cerium (III) hydroxide, when the cerium (III) hydroxide and the cerium (III) salt coexist, the nucleus generation speed and the crystal growth speed of the crystalline ceric oxide cannot be controlled, resulting in a wide particle size distribution and a nonuniform particle diameter disadvantageously. When the (OH)/($Ce^{3+}$) molar ratio is larger than 30, the crystallinity of the obtained crystalline ceric oxide particles lowers. When the particles are used as an abrasive, the polishing speed decreases disadvantageously. The particle size distribution of the obtained particles becomes wide and the particle diameter thereof becomes nonuniform disadvantageously.

The reaction time in the above first step, which differs according to the amount of charge, is generally 1 minute to 24 hours.

When the cerium (III) salt and the alkaline substance are reacted with each other in a gas containing oxygen such as air in place of the inert gas in the above first step, the generated cerium (III) hydroxide contacts oxygen and changes into a cerium (IV) salt and ceric oxide. Therefore, a large number of ceric oxide nuclei are produced in the aqueous medium, resulting in a wide particle size distribution of the obtained ceric oxide particles and a nonuniform particle diameter disadvantageously.

In the first aspect of the present invention, the second step is to produce crystalline ceric oxide particles having a particle diameter of 0.005 to 5 μm by blowing oxygen or a gas containing oxygen into the suspension obtained in the first step at a temperature of 10 to 95° C. and at an atmospheric pressure. In other words, the second step is to produce ceric oxide particles having high crystallinity from the cerium (III) hydroxide in the suspension obtained in the first step through a cerium (IV) salt in the presence of oxygen or a gas containing oxygen. The phrase "oxygen or a gas containing oxygen" refers to gaseous oxygen, air or a mixture gas of oxygen and an inert gas. Illustrative examples of the inert gas include a nitrogen gas, argon gas and the like. When a mixture gas is used, the content of oxygen contained in the mixture gas is preferably 1% or more by volume. In the second step of the first aspect of the present invention, air is particularly preferably used from a viewpoint of ease in production.

The second step of the first aspect of the present invention is carried out in the same reactor as that of the first step by introducing oxygen or a gas containing oxygen in place of the inert gas introduced in the first step immediately after the introduction of the inert gas in the first step. That is, oxygen or a gas containing oxygen is blown into the suspension obtained in the first step from a tubular gas introduction port immersed in the suspension.

Since the second step is carried out at an atmospheric pressure, almost the same amount of a gas as the amount introduced into the suspension is discharged from a discharge port provided in the above of the suspension in the reactor.

In the second step of the first aspect of the present invention, the total amount of oxygen or a gas containing oxygen blown into the suspension is such that the cerium (III) hydroxide can be changed into ceric oxide and the $(O_2)/(Ce^{3+})$ molar ratio is preferably 1 or more. If the molar ratio is less than 1, cerium (III) hydroxide remains in the suspension. When it contacts oxygen contained in air during cleaning after the second step, it may produce fine particles with the result that the particle size distribution of the obtained ceric oxide particles becomes wide and the particle diameter thereof becomes nonuniform disadvantageously.

The inflow and outflow of the gas per unit time in the second step is preferably 0.01 to 50 liters/min based on 1 liter of the reaction tank capacity.

When the first step of blowing an inert gas and the second step of blowing oxygen or a gas containing oxygen are not carried out successively, the surface of the suspension obtained in the first step contacts air, whereby a layer containing ceric oxide particles having various particle diameters is formed on the surface layer and hence, the particle diameter of ceric oxide particles obtained in the subsequent second step does not become uniform disadvantageously.

The second step of the first aspect of the present invention is preferably carried out while the suspension is stirred by a stirrer such as a disperser so that oxygen or a gas containing oxygen is present uniformly in the suspension. When the suspension is stirred by blowing a gas, stirring with a stirrer is not always necessary.

The production of crystalline ceric oxide particles by oxidizing cerium (III) hydroxide in the first aspect of the present invention means that the generation of crystalline ceric oxide particle nuclei and the growth of crystals thereof are carried out. The nucleus generation speed and crystal growth speed can be controlled by the concentration of a cerium salt, the concentration of the alkaline substance, the reaction temperature, and the concentration and supply of an oxidizing aqueous solution. In the present invention, the concentration of a cerium salt, the concentration of the alkaline substance, the reaction temperature, and the concentration and supply of an oxidizing aqueous solution at the time of nucleus generation and crystal growth can be changed freely. The particle diameter can be controlled to any value within the range of 0.005 to 5 µm by adjusting these factors.

The reaction temperature in the second step of the first aspect of the present invention greatly contributes to the control of the particle diameter. For instance, when nucleus generation and crystal growth are carried out at a temperature of 30° C., crystalline ceric oxide particles having a particle diameter of 5 to 10 nm (nanometer) are obtained and when nucleus generation and crystal growth are carried out at a temperature of 80° C., crystalline ceric oxide particles having a particle diameter of 80 to 100 nm are obtained. According to the first aspect of the present invention, there is further provided a second process for obtaining 1 to 3 µm crystalline ceric oxide particles by growing crystals using crystalline ceric oxide particles having a particle diameter of 80 to 100 nm as seed crystals while supplying cerium (III) hydroxide as a nutriment. That is, in the second process, the second step is carried out successively after the first step by adding crystalline ceric oxide particles having a particle diameter of 80 to 100 nm when starting materials are charged in the first step.

In the first aspect of the present invention, when the suspension of cerium (III) hydroxide containing an oxidizing substance such as nitric acid is subjected to a hydrothermal treatment at a temperature of not lower than 100° C. in an inert gas atmosphere instead of causing the suspension of cerium (III) hydroxide to react using an oxidant such as air at a temperature of 10 to 95° C. and at normal pressure, only crystalline ceric oxide particles having a particle diameter smaller than a desired value (for example, 30 nm or less) can be obtained. When the suspension of cerium (III) hydroxide containing an oxidizing substance such as nitric acid is treated at a temperature of not higher than 100° C. in an inert gas atmosphere, the reaction is incomplete and an unreacted product remains.

When the suspension of cerium (III) hydroxide containing no oxidizing substance is subjected to a hydrothermal treatment at a temperature of not lower than 100° C., crystalline ceric oxide particles cannot be obtained.

The ceric oxide particles obtained by the above production process are taken out from the reactor as a slurry and cleaned by ultrafiltration or filter press cleaning to remove impurities.

When the ceric oxide particles obtained by the first aspect of the present invention are observed by a transmission electron microscope (TEM), they have a particle diameter of 0.005 to 5 µm. When the ceric oxide particles are dried at 110° C. and measured for their diffraction pattern by an X-ray diffractometer, they are found to be cubic ceric oxide particles having main peaks at diffraction angles 2θ of 28.6°, 47.5° and 56.4° and high crystallinity as specified in ASTM Card No. 34-394. The specific surface area value measured by a gas adsorption method (BET method) of the ceric oxide particles is 2 to 200 m²/g.

The crystalline ceric oxide particles obtained by the first aspect of the present invention can be used as an abrasive, ultraviolet absorbing material, catalyst material, fuel cell material and the like as a ceric oxide sol which is prepared by re-dispersing the particles in a water medium, water-soluble organic solvent or a mixture solvent of water and a water-soluble organic solvent. In addition, the above ceric oxide sol can increase the concentration of ceric oxide up to 60 wt %. When the ceric oxide sol obtained by the first aspect of the present invention is left for a long time, part of the particles precipitates but can be re-dispersed easily by stirring and return to a dispersion state at the time of production. Therefore, the ceric oxide sol is stable for more than one year when it is kept at normal temperature.

When the ceric oxide sol of the first aspect of the present invention is used as an abrasive, it is an excellent abrasive for final finishing because it can greatly improve in the surface properties of the obtained polished surface with reduced surface roughness as compared with an abrasive composed of a ceric oxide powder slurry produced by calcining and grinding. In addition, the surface properties of a surface polished by the abrasive of the present invention are as good as and the polishing speed is several times faster than an abrasive composed of a conventional ceric oxide sol produced by a hydrothermal treatment. The reason for this seems to be that the surface of each particle is chemically active because the production temperature of the ceric oxide particle of the first aspect of the present invention is low.

Therefore, when the ceric oxide sol obtained by the first aspect of the present invention is used, the time required for the polishing step can be reduced and a high-quality polished surface can be obtained.

When quaternary ammonium ions ($NR_4^+$ wherein R is an organic group) are contained in the ceric oxide sol obtained by the first aspect of the present invention in a ($NR_4^+$)/$CeO_2$) molar ratio of 0.001 to 1 after impurities are removed by cleaning, the stability of an abrasive solution is improved advantageously. The quaternary ammonium ions are provided by adding quaternary ammonium silicate, quaternary ammonium halide, quaternary ammonium hydroxide or a mixture thereof, out of which quaternary ammonium silicate and quaternary ammonium hydroxide are particularly preferred. R is a methyl group, ethyl group, propyl group, hydroxyethyl group, benzyl group or the like. Illustrative examples of the quaternary ammonium compound include tetramethylammonium silicate, tetraethylammonium silicate, tetraethanolammonium silicate, monoethyl triethanolammonium silicate, trimethylbenzylammonium silicate, tetramethylammonium hydroxide and tetraethylammonium hydroxide.

A trace amount of an acid or a base can be contained. The above abrasive solution (sol) can be changed into an acidic abrasive solution (sol) by adding a water-soluble acid in a [$H^+$]/[$CeO_2$] molar ratio of 0.001 to 1. This acidic sol has a pH of 1 to 6, preferably 2 to 6. Illustrative examples of the water-soluble acid include inorganic acids such as hydrogen chloride and nitric acid, organic acids such as formic acid, acetic acid, oxalic acid, tartaric acid, citric acid and lactic acid, acidic salts thereof and mixtures thereof. When a water-soluble base is contained in an [$OH^-$]/[$CeO_2$] molar ratio of 0.001 to 1, the abrasive solution can be changed into an alkaline sol. This alkaline abrasive solution (sol) has a pH of 8 to 13, preferably 9 to 13. Illustrative examples of the water-soluble base include amines such as monoethanolamine, diethanolamine, triethanolamine, aminoethylethanolamine, N,N-dimethylethanolamine, N-methylethanolamine, monopropanolamine and morpholine, and ammonia in addition to the above-described quaternary ammonium silicate and quaternary ammonium hydroxide.

The ceric oxide sol obtained by the first aspect of the present invention is superior as an ultraviolet absorber in ultraviolet absorption property to titanic oxide.

According to a second aspect of the present invention, there is provided an abrasive composed of ceric oxide particles which are heated at a temperature of 50 to 250° C. in an aqueous medium in the presence of an ammonium salt.

Further, according to a third aspect of the present invention, there is provided a polishing method using an abrasive composed of ceric oxide particles which are heated at a temperature of 50 to 250° C. in an aqueous medium in the presence of an ammonium salt.

In the second and third aspects of the present invention, the ceric oxide particles used as a starting material are not limited to a particular kind, and ceric oxide particles produced by known methods can be used. For example, it is possible to use crystalline ceric oxide particles having a particle diameter of 0.05 to 5 µm produced by a dry process which comprises calcining a cerium salt such as cerous hydroxide, ceric hydroxide, cerous nitrate, basic cerium (IV) nitrate, cerous chloride, ceric chloride, cerous carbonate, ceric carbonate, basic cerous sulfate, basic ceric sulfate, cerous oxalate or ceric oxalate, or a rare earth compound essentially composed thereof at 1,000° C., grinding and classifying.

The crystalline ceric oxide particles obtained by the first aspect of the present invention are particularly preferably used as the ceric oxide particles that are used as a starting material in the second and third aspects of the present invention.

The aqueous medium of the second and third aspects of the present invention is generally water but can contain a trace amount of a water-soluble organic medium.

The ammonium salt used in the second and third aspects of the present invention may be an ammonium salt having a non-oxidizing anion component. This ammonium salt having a non-oxidizing anion component is the most preferably ammonium carbonate or ammonium hydrogencarbonate. They may be used alone or in admixture.

The ammonium salt having a non-oxidizing anion component is preferably contained in an aqueous medium in an [$NH_4^+$]/[$CeO_2$] molar ratio of 0.1 to 30 and the concentration of the ammonium salt in the aqueous medium is preferably 1 to 30 wt %.

When the ceric oxide particles are heated in an aqueous medium using the ammonium salt having a non-oxidizing anion component, they are heated at a temperature of 50 to 250° C., preferably 50 to 180° C. to obtain surface modified crystalline ceric oxide particles. The heating time can be set to 10 minutes to 48 hours. When the heating temperature is 100° C. or lower, an open (not-sealed) reactor is used. When the heating temperature is higher than 100° C., an autoclave or supercritical treatment apparatus is used. The heated ceric oxide particles are taken out from a treatment layer as a slurry and cleaned by ultrafiltration or filter press to remove impurities.

The ceric oxide particles whose surfaces are modified by heating in the presence of an ammonium salt having a non-oxidizing anion component can be easily dispersed into an aqueous medium to prepare an abrasive solution. This aqueous medium is preferably water.

When quaternary ammonium ions ($NR_4^+$ wherein R is an organic group) are contained in the sol of the ceric oxide particles whose surfaces are modified by heating in an aqueous medium in the presence of an ammonium salt having a non-oxidizing anion component in a ($NR_4^+$)/($CeO_2$) molar ratio of 0.001 to 1 after impurities are removed from the particles by cleaning, the stability of the abrasive solution is improved advantageously. The quaternary ammonium ions are provided by adding quaternary ammonium silicate, quaternary ammonium halide, quaternary ammonium hydroxide or a mixture thereof, out of which quaternary ammonium silicate and quaternary ammonium hydroxide are particularly preferred. R is a methyl group, ethyl group, propyl group, hydroxyethyl group, benzyl group or the like. Illustrative examples of the quaternary ammonium compound include tetramethylammonium silicate, tetraethylammonium silicate, tetraethanolammonium silicate, monoethyl triethanolammonium silicate, trimethylbenzylammonium silicate, tetramethylammonium hydroxide and tetraethylammonium hydroxide.

A trace amount of an acid or a base can be contained. The pH of the abrasive solution is preferably 2 to 12. The above abrasive solution (sol) can be changed into an acidic abrasive solution (sol) by adding a water-soluble acid in a [$H^+$]/[$CeO_2$] molar ratio of 0.001 to 1. This acidic sol has a pH of 2 to 6. Illustrative examples of the water-soluble acid include inorganic acids such as hydrogen chloride and nitric acid, organic acids such as formic acid, acetic acid, oxalic acid, tartaric acid, citric acid and lactic acid, acidic salts thereof and mixtures thereof. When a water-soluble base is contained in an [$OH^-$]/[$CeO_2$] molar ratio of 0.001 to 1, the abrasive solution can be changed into an alkaline sol. This alkaline abrasive solution (sol) has a pH of 8 to 12. Illustrative examples of the water-soluble base include amines such as monoethanolamine, diethanolamine, triethanolamine, aminoethylethanolamine, N,N-dimethylethanolamine, N-methylethanolamine, monopropanolamine and morpholine, and ammonia in addition to the above-described quaternary ammonium silicate and quaternary ammonium hydroxide.

The abrasive solution is stable for more than 1 year when it is kept at room temperature.

A polishing method using an abrasive containing ceric oxide whose surface is modified by heating in the presence of the above ammonium salt having a non-oxidizing anion component makes it possible to achieve a higher speed of polishing a silicon oxide film ($SiO_2$ film) for a semiconductor device, inorganic glass, crystal (such as a quartz piece for a crystal oscillator) and quartz glass than a polishing method using ceric oxide particles having the same particle diameter of the prior art. The reason for this is that the ceric oxide particles have both a mechanical polishing function and a chemical polishing function, a large number of hydroxyl groups ($\equiv$Ce—OH) are produced on the surface of the ceric oxide particle by heating in an aqueous medium in the presence of an ammonium salt having a non-oxidizing anion component, and this group ($\equiv$Ce—OH) exerts a chemical effect on the hydroxyl group ($\equiv$Si—OH) on the surface of a silicon oxide film, thereby improving the polishing speed. The ammonium salt having a non-oxidizing anion component is considered to exert a reducing effect on the surface of the ceric oxide particle.

In the second and third aspects of the present invention, the above effect (high polishing speed can be obtained) can be also obtained by using, as an abrasive, ceric oxide particles which have been heated in an aqueous medium in the presence of a water-soluble reducing substance such as hydrazine, ammonium nitrite or the like instead of heating in an aqueous medium in the presence of above ammonium salt having a non-oxidizing anion component. However, the above ammonium salt having a non-oxidizing anion component is preferably used because hydrazine and ammonium nitrite involve a risk such as explosion during handling.

Even when the ceric oxide particles are heated in purified water without using the above ammonium salt having a non-oxidizing anion component, the polishing speed is the same as in the case where starting material ceric oxide particles are used as an abrasive and hence, the above effect cannot be expected.

It is known that the polishing speed slows down gradually when an abrasive is used in the polishing step. Since an abrasive having a reduced polishing speed (that is, reduced polishing ability) causes a reduction in productivity in the polishing step, the abrasive itself has to be disposed. However, in the second and third aspects of the present invention, the used ceric oxide particles having reduced polishing ability can restore its original polishing ability and achieve improved polishing speed by heating at a temperature of 50 to 250° C. in an aqueous medium in the presence of an ammonium salt having a non-oxidizing anion component.

On the other hand, the ammonium salt used in the second and third aspects of the present invention can be an ammonium salt having an oxidizing anion component. This ammonium salt having an oxidizing anion component is the most preferably ammonium nitrate or ammonium sulfamate. They may be used alone or in admixture.

The above ammonium salt having an oxidizing anion component is preferably contained in an aqueous medium in an [$NH_4^+$]/[$CeO_2$] molar ratio of 0.1 to 30 and in a concentration of 1 to 30 wt %.

When the ceric oxide particles are heated in an aqueous medium using an ammonium salt having an oxidizing anion component, they are heated at 50 to 250° C., preferably 100 to 250° C. to obtain surface modified ceric oxide particles. The heating time can be set to 10 minutes to 96 hours. When the heating temperature is 100° C. or lower, an open (not-sealed) reactor is used. When the heating temperature is higher than 100° C., an autoclave or supercritical treatment apparatus is used.

The heated ceric oxide particles are taken out from a treatment layer as a slurry and cleaned by ultrafiltration or filter press to remove impurities.

The ceric oxide particles whose surfaces are modified by heating in the presence of an ammonium salt having an oxidizing anion component can be easily dispersed in an aqueous medium to prepare an abrasion solution. As the aqueous medium may be used water.

When quaternary ammonium ions ($NR_4^+$ wherein R is an organic group) are contained in the sol of the ceric oxide particles whose surfaces are modified by heating in an aqueous medium in the presence of an ammonium salt having an oxidizing anion component in a ($NR_4^+$)/($CeO_2$) molar ratio of 0.001 to 1 after impurities are removed by cleaning, the stability of the obtained abrasive solution is improved and the above effect (only a soft film such as an organic resin film is polished without polishing a hard film such as a silicon oxide film) is further improved advantageously. The quaternary ammonium ions are provided by adding quaternary ammonium silicate, quaternary ammonium halide, quaternary ammonium hydroxide or a mixture thereof, out of which quaternary ammonium silicate and quaternary ammonium hydroxide are particularly preferred. R is a methyl group, ethyl group, propyl group, hydroxyethyl group, benzyl group or the like. Illustrative examples of the quaternary ammonium compound include tetramethylammonium silicate, tetraethylammonium silicate, tetraethanolammonium silicate, monoethyl triethanolammonium silicate, trimethylbenzylammonium silicate, tetramethylammonium hydroxide and tetraethylammonium hydroxide.

A trace amount of a base can be contained. The pH of the abrasive solution is preferably 8 to 12. When a water-soluble base is contained in an [$OH^-$]/[$CeO_2$] molar ratio of 0.001 to 1, the abrasive solution (sol) can be changed into an alkaline sol. This alkaline abrasive solution (sol) has a pH of 8 to 12. Illustrative examples of the water-soluble base include amines such as monoethanolamine, diethanolamine, triethanolamine, aminoethylethanolamine, N,N-dimethylethanolamine, N-methylethanolamine, monopropanolamine and morpholine, and ammonia in addition to the above-described quaternary ammonium silicate and quaternary ammonium hydroxide.

The abrasive solution is stable for more than 1 year when it is kept at room temperature.

A polishing method using the surface modified ceric oxide particles which have been heated in the presence of an ammonium salt having an oxidizing anion component can be used as an abrasive to flatten an interlayer film for a semiconductor device. For instance, when a silicon oxide film ($SiO_2$ film) serves as a stopper (layer for stopping polishing), if only a soft film such as an organic resin film can be polished without polishing a hard film such as a silicon oxide film ($SiO_2$ film), that is, polishing of a soft layer such as an organic resin layer proceeds while polishing of a hard film such as a silicon oxide film ($SiO_2$ film) stops, lithography is made possible. That is, the abrasive has a low polishing speed for a silicon oxide film ($SiO_2$ film). The reason for this is assumed to be that the ceric oxide particles have both a mechanical polishing function and a chemical polishing function and hydroxyl groups ($\equiv$Ce—OH) on the surface of the ceric oxide particle exerts a chemical effect on hydroxyl groups ($\equiv$Si—OH) on the surface of a silicon oxide film, thereby improving the polishing speed. It is considered that by heating in an aqueous medium in the presence of an ammonium salt having an oxidizing anion component, the number of the hydroxyl groups ($\equiv$Ce—OH) on the surface of the ceric oxide particle is reduced and the chemical polishing function of the ceric oxide particle is lowered. The ammonium salt having an oxidizing anion component is assumed to exert an oxidizing effect on the surface of the ceric oxide particle.

For example, in the planarization of an interlayer film for a semiconductor device, the polishing speed can be freely controlled by using an abrasive containing ceric oxide particles heated in an aqueous medium in the presence of an ammonium salt having a non-oxidizing anion component and an abrasive containing ceric oxide particles heated in an aqueous medium in the presence of an ammonium salt having an oxidizing anion component alternately for polishing. With this polishing method, a material to be polished including a hard silicon oxide film ($SiO_2$) portion and a soft organic resin film portion can be polished with high accuracy using two different abrasives. The word "alternately" means that each of these abrasives is used separately to polish a surface to be polished at least one time in this method.

In the second and third aspects of the present invention, when the ceric oxide particles which have been heated at a temperature of 50 to 250° C. in an aqueous medium in the presence of an ammonium salt having a non-oxidizing anion component or an ammonium salt having an oxidizing anion component are dried and measured for their diffraction pattern by an X-ray diffractometer, they are found to be cubic ceric oxide particles having main peaks at diffraction angles $2\theta$ of 28.6°, 47.5° and 56.4° and high crystallinity as specified in ASTM Card No. 34-394.

EXAMPLE 1

37.0 kg of a 9 wt % ammonium aqueous solution which was equivalent to an $NH_3/Ce^{3+}$ molar ratio of 6 was charged into a 100-liter stainless steel reaction tank and a nitrogen gas was blown into the reaction tank from a glass nozzle at a rate of 2 $Nm^3$/hr to substitute the inside of the reaction tank with the nitrogen gas while the temperature of the solution was maintained at 30° C. A solution of 14.0 kg of cerium (III) nitrate dissolved in 40 kg of purified water was added to the reaction tank little by little to obtain a suspension of cerium (III) hydroxide. After this suspension was heated to 80° C., air was blown into the tank from the glass nozzle at a rate of 4 $Nm^3$/hr in place of the nitrogen gas to start an oxidation reaction for converting cerium (III) into cerium (IV). The oxidation reaction ended in 3 hours. When the solution after the reaction was returned to room temperature, a reaction solution having light yellow fine particles and a pH of 7.2 was obtained.

When the fine particles were separated from the reaction solution by filtration, cleaned and observed through a transmission electron microscope (TEM), they were found to be particles having a particle diameter of 80 to 100 nm. The yield of the particles was almost 100%. When the fine particles were dried and measured for their powder X-ray diffraction, they had main peaks at diffraction angles $2\theta$ of 28.6°, 47.5° and 56.4° which coincided with the characteristic peaks of cubic crystalline ceric oxide specified in ASTM Card No. 34-394. The specific surface area value measured by a gas adsorption method (BET method) of the ceric oxide particles was 30 $m^2$/g.

A 10 wt % nitric acid aqueous solution was added to cleaned $CeO_2$ particles in a [$HNO_3/CeO_2$] molar ratio of 0.01 to adjust the concentration of $CeO_2$ to 5 wt % and pH to 5.0. A polishing test was carried out using this sol as an abrasive solution under the following conditions.

The abrasive of Example 1 was polished by a commercially available correction ring type polishing machine. The polishing speed was obtained by forming a groove in a crystal base and measuring the depth of the groove with a tracer type surface roughness meter.

a. polishing cloth: polyurethane impregnated nonwoven cloth ($\phi$250 mm)
b. object to be polished: AT cut quartz crystal base ($\phi$14×1.0 mm)
c. revolution: 70 rpm
d. polishing pressure: 400 $g/cm^2$, and
e. polishing time: 60 minutes Table 1 shows polishing characteristics (polishing speed and surface roughness Rmax value)

A sol having a $CeO_2$ concentration of 5 wt % was applied to quartz glass to a film thickness of 0.5 $\mu$m by an applicator having a 0.01 mm clearance. The sol was dried at 110° C. for 1 hour and used for the measurement of transmittance of light having a wavelength range of 200 to 600 nm using an ultraviolet absorption meter to measure the absorption of light having an ultraviolet to visible range of the coating glass. The result is shown in FIG. 1. For comparison, a commercially available titanium oxide sol was coated on quartz glass and used for the measurement of transmittance of light having an ultraviolet to visible range. The result is shown in FIG. 1. In FIG. 1, the axis of abscissa indicates the wavelength of light (nm) and the axis of ordinate indicates transmittance (%). As the lower the transmittance, the higher absorption power a sample has.

EXAMPLE 2

740 g of a 9 wt % ammonium aqueous solution which was equivalent to an $NH_3/Ce^{3+}$ molar ratio of 6 was charged into a 2-liter separable flask and a nitrogen gas was blown into the flask from a glass nozzle at a rate of 2 liters/min to substitute the inside of the flask with the nitrogen gas while the temperature of the solution was maintained at 30° C. A solution of 76.8 g of cerium (III) nitrate dissolved in 500 g of purified water was added to the flask little by little to obtain a suspension of cerium (III) hydroxide. Thereafter, air was blown into the flask from the glass nozzle at a rate of 4 liters/min in place of the nitrogen gas to start an oxidation reaction for converting cerium (III) into cerium (IV) while the temperature of the suspension was maintained at 30° C. The oxidation reaction ended in 12 hours. When the solution after the reaction was returned to room temperature, a reaction solution having yellow fine particles and a pH of 6.5 was obtained.

When the fine particles were separated from the reaction solution by filtration, cleaned and observed through a transmission electron microscope (TEM), they were found to be particles having a particle diameter of 5 to 10 nm. When the particles were dried and measured for their powder X-ray diffraction, their main peaks coincided with the characteristic peaks of cubic crystalline ceric oxide.

The specific surface area value measured by a gas adsorption method (BET method) of the ceric oxide particles was 94 m$^2$/g.

EXAMPLE 3

740 g of a 21 wt % sodium hydroxide aqueous solution which was equivalent to a NaOH/Ce$^{3+}$ molar ratio of 6 was charged into a 2-liter separable flask and a nitrogen gas was blown into the flask from a glass nozzle at a rate of 2 liters/min to substitute the inside of the flask with the nitrogen gas while the temperature of the solution was maintained at 30° C. A solution of 216 g of cerium (III) nitrate dissolved in 500 g of purified water was added to the flask little by little to obtain a suspension of cerium (III) hydroxide. After the suspension was heated to 80° C., air was blown from the glass nozzle at a rate of 4 liters/min in place of the nitrogen gas to start an oxidation reaction for converting cerium (III) into cerium (IV). The oxidation reaction ended in 12 hours. When the solution after the reaction was returned to room temperature, a reaction solution having light yellow fine particles and a pH of 8.5 was obtained.

When the fine particles were separated from the reaction solution by filtration, cleaned and observed through a transmission electron microscope (TEM), they were found to be particles having a particle diameter of 10 to 20 nm. When the particles were dried and measured for their powder X-ray diffraction, their main peaks coincided with the characteristic peaks of cubic crystalline ceric oxide.

COMPARATIVE EXAMPLE 1

433 g of cerium (III) nitrate and 2,000 g of purified water were charged into a beaker and 60 g of 28 wt % ammonium water was added to the beaker in an NH$_3$/Ce$^{4+}$ molar ratio of 1 under agitation to obtain a slurry containing a colloidal precipitate of cerium (IV) hydroxide. This slurry was placed into a 3-liter autoclave apparatus made from glass lining and subjected to a hydrothermal treatment at a temperature of 150° C. and a pressure of 4 kg/cm$^2$ for 20 hours. When the solution after the reaction was returned to room temperature and atmospheric pressure, a reaction solution having light yellow fine particles and a pH of 1.4 was obtained.

When the fine particles were separated from the reaction solution by filtration, cleaned and analyzed as in Example 1, they were found to be crystalline ceric oxide particles having a particle diameter of 15 to 25 nm.

The specific surface area measured by a gas adsorption method (BET method) of the ceric oxide particles was 54 m$^2$/g. A 10 wt % nitric acid aqueous solution was added to the cleaned CeO$_2$ particles in a [HNO$_3$/CeO$_2$] molar ratio of 0.01 to adjust the concentration of CeO$_2$ to 5 wt % and pH to 5.0. The polishing characteristics (polishing speed and surface roughness Rmax value) of this sol as an abrasive were evaluated under the same conditions as in Example 1 and the results are shown in Table 1.

As a reference, commercially available ceria powders (composed of ceric oxide having an average particle diameter of 0.7 μm) were dispersed in purified water and a 10 wt % nitric acid aqueous solution was added to the dispersion in an [HNO$_3$/CeO$_2$] molar ratio of 0.01 to adjust the concentration of CeO$_2$ to 5 wt % and pH to 5.0. The polishing characteristics (polishing speed and surface roughness Rmax value) of this slurry as an abrasive were evaluated under the same conditions as in Example 1 and the results are shown in Table 1.

COMPARATIVE EXAMPLE 2

43 g of cerium (III) nitrate and 200 g of purified water were charged into a beaker and heated under agitation until they were boiled, and 29 g of a 35 wt % hydrogen peroxide solution was added to the mixture little by little without causing the bumping of the solution to start an oxidation reaction for converting cerium (III) into cerium (IV). The thus obtained aqueous solution of basic cerium (IV) nitrate was cooled, and 24 g of a 28 wt % ammonium solution which was equivalent to an NH$_3$/Ce$^{4+}$ molar ratio of 4 was added to the aqueous solution under agitation to obtain a slurry containing ammonium nitrate having an NO$_3$/Ce$^{4+}$ molar ratio of 3, ammonia having an NH$_3$/Ce$^{4+}$ molar ratio of 1 and a colloidal precipitate of cerium (IV) hydroxide. After this colloidal precipitate was separated, cleaned with purified water and re-dispersed, its pH was adjusted to 5.0 with dilute nitric acid. 85 g of this slurry was charged into a 120 cc Teflon autoclave apparatus and subjected to a hydrothermal treatment at a temperature of 180° C. and a pressure of 10 kg/cm$^2$ for 15 hours. When the solution after the reaction was returned to room temperature and atmospheric pressure, a reaction solution having light yellow fine particles and a pH of 0.8 was obtained. When the fine particles were separated from the reaction solution by filtration, cleaned and analyzed as in Example 1, they were found to be crystalline ceric oxide particles having a particle diameter of 5 to 10 nm.

TABLE 1

| | polishing characteristics | |
|---|---|---|
| ceric oxide abrasive | polishing speed (μm/hr) | surface roughness Rmax (angstrom) |
| Example 1 | 3.2 | 30 |
| Comparative Example 1 | 1.3 | 30 |
| commercially-available ceria powders | 4.6 | 65 |

Table 1 shows that an abrasive composed of the ceric oxide particles of Example 1 obtained by the process of the present invention has a polishing speed about 2.5 times higher than an abrasive composed of the ceric oxide particles of Comparative Example 1 obtained by a hydrothermal method. The surface polished by the abrasive composed of the ceric oxide particles of Example 1 obtained by the process of the present invention is more smooth than the surface polished by an abrasive composed of commercially available ceric oxide particles obtained by a calcining method.

When the ceric oxide sol obtained in Example 1 or Comparative Example 1 is used as an abrasive, the surface flatness remains unchanged even when the polished surface is etched because processing distortion is small. However, when a slurry obtained by dispersing commercially available ceria powders used as a reference in purified water is used as an abrasive, the polished surface becomes uneven by etching disadvantageously because processing distortion is large.

It is understood from FIG. 1 that the ceric oxide of the present invention has higher ultraviolet absorption power than titanic oxide.

EXAMPLE 4

740 g of a 9 wt % ammonium aqueous solution which was equivalent to an $NH_4OH/Ce^{3+}$ molar ratio of 6 was charged into a 2-liter separable flask and a nitrogen gas was blown into the flask from a glass nozzle at a rate of 2 liters/min to substitute the inside of the flask with the nitrogen gas while the temperature of the solution was maintained at 30° C. A solution of 216 g of cerium (III) nitrate dissolved in 500 g of purified water was added to the flask little by little to obtain a suspension of cerium (III) hydroxide. After the suspension was heated to 80° C., air was blown from the glass nozzle at a rate of 4 liters/min in place of the nitrogen gas to start an oxidation reaction for converting cerium (III) into cerium (IV). The oxidation reaction ended in 3 hours and a reaction solution having light yellow ceric oxide particles and a pH of 7.2 was obtained. The ceric oxide particles were used as starting material particles.

When the ceric oxide particles which would be the starting material particles were separated from the reaction solution by filtration, cleaned and observed through a transmission electron microscope (TEM), they were found to be particles having a particle diameter of 80 to 100 nm. When the particles were dried and measured for their powder X-ray diffraction, they had major peaks at diffraction angles $2\theta$ of 28.6°, 47.5° and 56.4° which coincided with the characteristic peaks of cubic crystalline ceric oxide specified in ASTM Card No. 34-394.

1,500 g of a 10 wt % ammonium carbonate aqueous solution was charged into a 3-liter separable flask and 150 g of the ceric oxide particles as starting material particles obtained above were added to the flask and heated at 95° C. for 8 hours. When the heated slurry was separated by filtration, cleaned and observed through a transmission electron microscope (TEM), they were found to have the same particle diameter of 80 to 100 nm as that before surface modification. When the surface modified particles were dried and measured for their powder X-ray diffraction, they were found to be cubic ceric oxide particles. A tetramethyl ammonium silicate aqueous solution was added to the surface modified crystalline ceric oxide particles which were filtered and cleaned again in an $[N(CH_3)_4^+/CeO_2]$ molar ratio of 0.01 to adjust the concentration of $CeO_2$ to 20 wt % and pH to 10.3. 750 g of this 20 wt % crystalline ceric oxide sol was prepared as an abrasive solution.

EXAMPLE 5

1,500 g of a 10 wt % ammonium carbonate aqueous solution was charged into a 3-liter high-pressure container made from glass lining and 150 g of ceric oxide particles which were produced in the same manner as in Example 4 as starting material particles were placed in the high-pressure container and subjected to a hydrothermal treatment at 150° C. for 20 hours. When the heated slurry was separated by filtration, cleaned and observed through a transmission electron microscope (TEM), they were found to have the same particle diameter of 80 to 100 nm as that before surface modification. When the surface modified particles were dried and measured for their powder X-ray diffraction, they were found to be cubic ceric oxide particles. A tetramethyl ammonium silicate aqueous solution was added to the surface modified crystalline ceric oxide particles which were filtered and cleaned again in an $[N(CH_3)_4^+/CeO_2]$ molar ratio of 0.01 to adjust the concentration of $CeO_2$ to 20 wt % and pH to 10.3. 750 g of this 20 wt % crystalline ceric oxide sol was prepared as an abrasive solution.

EXAMPLE 6

1,500 g of a 10 wt % ammonium nitrate aqueous solution was charged into a 3-liter high-pressure container made from glass lining and 150 g of ceric oxide particles which were produced in the same manner as in Example 4 as starting material particles were placed in the high-pressure container and subjected to a hydrothermal treatment at 150° C. for 20 hours. When the heated slurry was separated by filtration, cleaned and observed through a transmission electron microscope (TEM), they were found to have the same particle diameter of 80 to 100 nm as that before surface modification. When the surface modified particles were dried and measured for their powder X-ray diffraction, they were found to be cubic ceric oxide particles. The surface modified crystalline ceric oxide particles which were filtered and cleaned again were dispersed in purified water and further a tetramethyl ammonium hydroxide aqueous solution was added to the dispersion in an $[N(CH_3)_4^+/CeO_2]$ molar ratio of 0.01 to stabilize pH at 10.3. 750 g of this 20 wt % crystalline ceric oxide sol was prepared as an abrasive solution.

EXAMPLE 7

1,500 g of a 10 wt % ammonium carbonate aqueous solution was charged into a 3-liter separable flask and 150 g of abrasive particles (particle diameter of 1 μm, $CeO_2$ content of 88 wt %, $La_2O_3$ content of 7 wt % and $SiO_2$ content of 5 wt %) obtained by calcining and grinding a commercially available rare earth compound essentially composed of cerium were placed in the separable flask and heated at 95° C. for 8 hours to modify the surface of each particle. When the heated slurry was separated by filtration, cleaned and observed through a transmission electron microscope (TEM), they were found to have the same particle diameter of 1 μm as that before surface modification. When the obtained surface modified particles were dried and measured for their powder X-ray diffraction, it was found that their main peaks included the peaks of cubic ceric oxide. A tetramethyl ammonium silicate aqueous solution was added to the above surface modified crystalline ceric oxide particles which were filtered and cleaned again in an $[N(CH_3)_4^+/CeO_2]$ molar ratio of 0.01 to adjust the concentration of $CeO_2$ to 20 wt % and pH to 10.3. 750 g of this 20 wt % abrasive particle dispersion was prepared as an abrasive solution.

COMPARATIVE EXAMPLE 3

Ceric oxide particles having a particle diameter of 80 to 100 nm which were produced in the same manner as in Example 4 as starting material particles were dispersed in purified water without being surface modified by heating in the presence of an ammonium salt and a tetramethyl ammonium silicate aqueous solution was added to the dispersion in an $[N(CH_3)_4^+/CeO_2]$ molar ratio of 0.01 to adjust the concentration of $CeO_2$ to 20 wt % and pH to 10.3. 750 g of this 20 wt % crystalline ceric oxide sol was prepared as an abrasive solution.

COMPARATIVE EXAMPLE 4

Abrasive particles (particle diameter of 1 μm, $CeO_2$ content of 88 wt %, $La_2O_3$ content of 7 wt % and $SiO_2$ content of 5 wt %) obtained by calcining and grinding a commercially available rare earth compound essentially composed of cerium were dispersed in purified water without surface modification by heating in the presence of an ammonium salt and a tetramethyl ammonium silicate aqueous solution was added to the dispersion in an $[N(CH_3)_4{}^+/CeO_2]$ molar ratio of 0.01 to adjust the concentration of $CeO_2$ to 20 wt % and pH to 10.3. 750 g of this 20 wt % crystalline ceric oxide sol was prepared as an abrasive solution.

The abrasives of Examples 4 to 7 and Comparative Examples 3 and 4 were polished under the following conditions using a commercially available Oscar type lens polishing machine. The polishing speed was obtained by forming a groove in crystal glass and measuring the depth of the groove with a tracer type surface roughness meter. The results are shown in Table 2.

a. polishing cloth: fluororesin ($\phi$250 mm) or foamed polyurethane ($\phi$250 mm)
b. object to be polished: quartz glass ($\phi$25 mm)
c. revolution: 30 rpm, and
d. polishing pressure: 270 g/cm$^2$

TABLE 2

| abrasive | polishing speed (nm/min) | |
|---|---|---|
| | fluororesin as polishing cloth | foamed polyurethane as polishing cloth |
| Example 4 | 48 | 90 |
| Example 5 | 40 | 83 |
| Example 6 | 1 | — |
| Example 7 | — | 502 |
| Comparative Example 3 | 21 | 38 |
| Comparative Example 4 | — | 438 |

The abrasives of Examples 4 and 5 composed of ceric oxide particles whose surfaces were modified by heating in an aqueous medium in the presence of an ammonium salt having a non-oxidizing anion component have a polishing speed almost double that of the abrasive of Comparative Example 3 composed of ceric oxide particles whose surfaces were not modified under the same polishing conditions. Abrasives having an improved polishing speed as shown by Examples 4 and 5 can achieve a higher polishing speed than an abrasive composed of ceric oxide particles of the prior art having the same particle diameter as that of the above abrasives for the polishing of a hard film such as a silicon oxide film ($SiO_2$ film) of a semiconductor device and a hard substance such as inorganic glass, crystal (such as a quartz piece of a crystal oscillator) or quartz glass.

As for the relationship between the abrasives of Examples 4 and 5 and the abrasive of Comparative Example 3, an abrasive composed of surface modified particles has a high polishing speed as in the relationship between the abrasive of Example 7 and the abrasive of Comparative Example 4 even when abrasive particles obtained by calcining and grinding a commercially available rare earth compound essentially composed of cerium are used as starting material particles.

On the other hand, the abrasive of Example 6 composed of ceric oxide particles whose surfaces are modified by heating in an aqueous medium in the presence of an ammonium salt having an oxidizing anion component has a polishing speed 1/20 that of the abrasive of Comparative Example 3 composed of ceric oxide particles whose surfaces are not been modified, under the same polishing conditions.

As for usage of the abrasive of Example 6, supposing that the abrasive of Example 6 of the present invention is used to polish a hard $SiO_2$ film formed on the uneven surface of an LSI chip as a stopper and a soft film (an organic resin film or $SiO_2$ film containing impurities) formed on the hard $SiO_2$ film to flatten an interlayer film using CMP, for example, the soft film formed on the surfaces of projecting portions is first polished and then polishing is stopped at hard $SiO_2$ film portions exposed to the projecting portions, whereby only soft film portions can be polished selectively.

Supposing that the abrasives of Examples 4 and 5 and the abrasive of Example 6 are combined to polish a soft film (an organic resin film or $SiO_2$ film containing impurities) coated on the uneven surface of an LSI chip and a hard $SiO_2$ film coated on the soft film, the hard $SiO_2$ film on the surfaces of projecting portions is first polished with the abrasives of Examples 4 and 5, and the soft film exposed to the projecting portions is polished with the abrasive of Example 6, whereby the mountain of each projecting portion gradually lowers and polishing is stopped when the hard $SiO_2$ film (stopper) in a recessed portion is reached. Thus, the surface of the LSI is planarization.

The present invention makes it possible to produce crystalline ceric oxide particles having a particle diameter controlled to any value within the range of 0.005 to 5 $\mu$m by blowing oxygen or a gas containing oxygen into a suspension of cerium (III) hydroxide obtained by adding an alkaline substance to a cerium (III) salt in an inert gas atmosphere such as a nitrogen gas at a temperature of 10 to 95° C. and at an atmospheric pressure.

Since crystalline ceric oxide particles can be produced at an atmospheric pressure (normal pressure) by the process of the present invention, a bulky high-pressure container is not required, thereby ensuring safe operation and low costs.

Since the nucleus generation speed and crystal growth speed of crystalline ceric oxide particles can be controlled individually by the concentration of the cerium (III) salt, the concentration of the alkaline substance, the reaction temperature and the concentration and supply of the oxidizing aqueous solution in the process of the present invention, the particle diameter of the crystalline ceric oxide particles can be controlled to any value within the range of 0.005 to 5 $\mu$m.

The ceric oxide according to the present invention is used as an abrasive, ultraviolet absorbing material, catalyst material, fuel cell material and the like. Out of these application fields, it is particularly useful as an abrasive and ultraviolet absorbing material.

As an abrasive, the ceric oxide of the present invention can be used to polish oxide films and organic films for semiconductor devices, optical crystal materials such as glass, quartz crystal and lithium niobate, ceramic materials such as aluminum nitride, alumina, ferrite and zirconia, and metals such as aluminum, copper and tungsten.

As an ultraviolet absorbing material, the crystalline ceric oxide particles having a particle diameter of 5 to 10 nm of the present invention can be used to improve the weatherability of ultraviolet absorbing glass, and ultraviolet absorbing polymer films and plastics.

In the present invention, an abrasive comprising ceric oxide particles or particles essentially composed of ceric oxide obtained by heating ceric oxide particles or particles essentially composed of ceric oxide obtained by calcining and grinding a composition containing a rare earth element essentially composed of cerium at a temperature of 50 to 250° C. in an aqueous medium in the presence of an ammonium salt. This abrasive is composed of surface modified ceric oxide particles and the properties of the obtained abrasive composed of ceric oxide particles differ depending on types of a chemical (ammonium salt) used for surface modification.

Using an abrasive composed of ceric oxide particles whose surfaces are modified by heating in an aqueous medium in the presence of an ammonium salt having a non-oxidizing anion component, a hard film such as a silicon oxide film ($SiO_2$ film) of a semiconductor device, inorganic glass, quartz crystal (such as a quartz piece of a quartz crystal oscillator) and a hard substance such as quartz glass can be polished at a higher speed than when using an abrasive composed of ceric oxide particles of the prior art having the same particle diameter as that of the above abrasive.

Using an abrasive composed of ceric oxide particles whose surfaces are modified by heating in an aqueous medium in the presence of an ammonium salt having an oxidizing anion component, a hard film such as a silicon oxide film ($SiO_2$ film) is polished at a much lower speed than when using an abrasive composed of ceric oxide particles of the prior art having the same particle diameter as that of the above abrasive.

Though polishing for wide application is made possible by using two different abrasives independently, selective polishing is possible in the field of semiconductor devices by combining the two different abrasives.

What is claimed is:

1. A process for producing crystalline ceric oxide particles having a particle diameter of 0.005 to 5 μm comprising the steps of:

reacting a cerium (III) salt with an alkaline substance in an (OH)/($Ce^{3+}$) molar ratio of 3 to 30 in an aqueous medium in an inert gas atmosphere to produce a suspension of cerium (III) hydroxide, and immediately blowing oxygen or a gas containing oxygen into the suspension at a temperature of 10 to 95° C. and at an atmospheric pressure.

2. The process of claim 1, wherein the alkaline substance is sodium hydroxide, potassium hydroxide, ammonium hydroxide or a mixture thereof.

3. The process of claim 1, wherein the gas containing oxygen is air.

4. An abrasive composed of ceric oxide particles heated at a temperature of 50 to 250° C. in an aqueous medium in the presence of an ammonium salt.

5. The abrasive of claim 4, wherein an anion component of the ammonium salt is a non-oxidizing component.

6. The abrasive of claim 5, wherein the ammonium salt having a non-oxidizing anion component is ammonium carbonate, ammonium hydrogencarbonate or a mixture thereof.

7. The abrasive of claim 4, wherein an anion component of the ammonium salt is an oxidizing component.

8. The abrasive of claim 7, wherein the ammonium salt having an oxidizing anion component is ammonium nitrate, ammonium sulfamate or a mixture thereof.

9. A polishing method using an abrasive composed of ceric oxide particles heated at a temperature of 50 to 250° C. in an aqueous medium in the presence of an ammonium salt.

10. A polishing method using an abrasive composed of ceric oxide particles heated at a temperature of 50 to 250° C. in an aqueous medium in the presence of ammonium carbonate, ammonium hydrogencarbonate or a mixture thereof.

11. A method of polishing a semiconductor device using an abrasive composed of ceric oxide particles heated at a temperature of 100 to 250° C. in an aqueous medium in the presence of ammonium nitrate, ammonium sulfamate or a mixture thereof.

12. A method of polishing a semiconductor device using a first abrasive and a second abrasive, alternately, wherein said first abrasive is an abrasive composed of ceric oxide particles heated at a temperature of 50 to 250° C. in an aqueous medium in the presence of ammonium carbonate, ammonium hydrogencarbonate or a mixture thereof, and wherein said second abrasive is an abrasive composed of ceric oxide particles heated at a temperature of 50 to 250° C. in an aqueous medium in the presence of ammonium nitrate, ammonium sulfamate or a mixture thereof.

* * * * *